US009201165B2

(12) United States Patent
Tsai et al.

(10) Patent No.: US 9,201,165 B2
(45) Date of Patent: Dec. 1, 2015

(54) DETECTION CIRCUIT

(71) Applicant: LITE-ON IT CORPORATION, Taipei (TW)

(72) Inventors: Yu-Nan Tsai, Hsinchu (TW); Kai-Wen Cheng, Hsinchu (TW); Chia-Hao Hsu, Hsinchu (TW); Chun-Lai Hsiao, Hsinchu (TW)

(73) Assignee: Lite-On Technology Corporation, Taipei (TW)

( * ) Notice: Subject to any disclaimer, the term of this patent is extended or adjusted under 35 U.S.C. 154(b) by 148 days.

(21) Appl. No.: 14/044,884

(22) Filed: Oct. 3, 2013

(65) Prior Publication Data

US 2015/0042365 A1    Feb. 12, 2015

(30) Foreign Application Priority Data

Aug. 12, 2013 (CN) .......................... 2013 1 0348811

(51) Int. Cl.
*G01R 27/26* (2006.01)
*G02B 1/00* (2006.01)
*H03L 1/00* (2006.01)
*G01D 5/24* (2006.01)
*H01L 21/00* (2006.01)

(52) U.S. Cl.
CPC .. *G02B 1/00* (2013.01); *G01D 5/24* (2013.01); *H03L 1/00* (2013.01); *H01L 21/00* (2013.01); *H03L 2207/00* (2013.01)

(58) Field of Classification Search
CPC ....... H03L 1/00; H03L 2207/00; H01L 21/00; H01L 2221/00; H01L 2223/00; H01L 2924/00
USPC .......................................... 324/681
See application file for complete search history.

(56) References Cited

U.S. PATENT DOCUMENTS

| | | | | |
|---|---|---|---|---|
| 3,820,103 | A * | 6/1974 | Fearon ............... | G08B 13/2408 331/8 |
| 3,820,104 | A * | 6/1974 | Fearon ............... | G08B 13/2408 340/572.2 |
| 6,522,868 | B1 * | 2/2003 | Stilwell ............... | 455/76 |
| 7,346,099 | B2 * | 3/2008 | Mauritz et al. ......... | 375/219 |
| 8,723,567 | B1 * | 5/2014 | Dang ................ | H03H 11/1269 327/156 |
| 2012/0318060 | A1 * | 12/2012 | Ruby ................ | 73/514.32 |
| 2013/0181718 | A1 * | 7/2013 | Richardson ........... | G01V 3/101 324/327 |

\* cited by examiner

*Primary Examiner* — Huy Q Phan
*Assistant Examiner* — Temilade Rhodes-Vivour
(74) *Attorney, Agent, or Firm* — Jianq Chyun IP Office

(57) ABSTRACT

A detection circuit is provided. A detection signal corresponding to an equivalent capacitance value of a micro-electro-mechanical system is generated by an oscillator, and the equivalent capacitance value of the micro-electro-mechanical system varies with a location of the micro-electro-mechanical system.

5 Claims, 2 Drawing Sheets

DETECTION CIRCUIT

CROSS-REFERENCE TO RELATED APPLICATION

This application claims the priority benefit of China application serial no. 201310348811.6, filed on Aug. 12, 2013. The entirety of the above-mentioned patent application is hereby incorporated by reference herein and made a part of this specification.

BACKGROUND OF THE INVENTION

1. Field of the Invention

The invention relates to a detection circuit, and more particularly, to a detection circuit for detecting a location of a micro-electro-mechanical system.

2. Description of Related Art

A micro-electro-mechanical system (MEMS) is a collection of micro-electro-mechanical components manufactured in a miniaturized structure by using a manufacturing technology much similar to a technology for manufacturing integrated circuits. Nevertheless, in comparison to an integrated circuit in conventional art, a micro-electro-mechanical system apparatus interacts more with environment in terms of interactions such as mechanics, optics or magnetic. The micro-electro-mechanical system apparatus can include tiny electro-mechanical components such as motors, pumps, valves, switches, capacitors, accelerometers, sensors, capacitance sensors, pixel elements, microphones or actuators, etc. Said electro-mechanical components usually accomplish a preset goal by utilizing micro-mechanical structures together with semiconductor components such as the integrated circuit.

The micro-electro-mechanical system is currently an industry with rapid advancement. Moreover, optical elements manufactured by utilizing the micro-electro-mechanical system have gradually become more important in technical fields of telecommunication and computer network. Currently, an optical element with the micro-electro-mechanical system is also applied by a laser based pico projector, such element is known as a MEMS scanning mirror adopting two driving methods including electromagnetic type and electrostatic type. For outputting a projected image, a favorable quality of the projected image can only be obtained when locations of a pixel data and the MEMS scanning mirror are synchronized. Accordingly, it is an essential topic to accurately obtain a location of the micro-electro-mechanical system.

SUMMARY OF THE INVENTION

The invention is directed to a detection circuit capable of accurately detecting a location of a MEMS scanning mirror.

A detection circuit of the invention is suitable for detecting a location of a micro-electro-mechanical system. The detection circuit includes an oscillator, a phase lock loop unit, a first low pass filter unit and an amplifying unit. Therein, an input terminal of the oscillator is coupled to the micro-electro-mechanical system, and a first oscillation signal is generated according to an equivalent capacitance value of the micro-electro-mechanical system. The phase lock loop unit performs a phase lock to the first oscillation signal to output a phase lock control signal. The first low pass filter unit is coupled to the phase lock loop unit, and a low pass filtration is performed to the phase lock control signal to generate a filter signal. The amplifying unit is coupled to the first low pass filter unit, and the filter signal is amplified to generate a detection signal.

In an embodiment of the invention, the oscillator includes a blocking capacitor, an inverting unit, a second low pass filter unit, a feedback resistor and a buffer unit.

Therein, an input terminal of the inverting unit is coupled to the micro-electro-mechanical system. The second low pass filter unit is coupled between the input terminal and an output terminal of the inverting unit. The feedback resistor is coupled between the input terminal and the output terminal of the inverting unit. The buffer unit is coupled between the output terminal of the inverting unit and the phase lock loop unit to buffer a voltage outputted by the inverting unit.

In an embodiment of the invention, the detection circuit further includes a blocking capacitor coupled between the micro-electro-mechanical system and the input terminal of the inverting unit.

In an embodiment of the invention, the second low pass filter unit includes a resistor, a capacitor and an inductor. Therein, a terminal of the resistor is coupled to the output terminal of the inverting unit. The capacitor is coupled between another terminal of the resistor and a ground. The inductor is coupled between a common connection point of the resistor and the capacitor, and the input terminal of the inverting unit.

In an embodiment of the invention, the first low pass filter unit includes a resistor and a capacitor. Therein, the resistor is coupled between an output terminal of the phase lock loop unit and an input terminal of the amplifying unit. The capacitor is coupled between the input terminal of the amplifying unit and a ground.

In an embodiment of the invention, the amplifying unit includes an operational amplifier, a first resistor and a second resistor. Therein, a positive input terminal of the operational amplifier is coupled to the first low pass filter unit. The first resistor is coupled between a negative input terminal and an output terminal of the operational amplifier. The second resistor is coupled between the negative input terminal of the operational amplifier and a reference voltage.

In an embodiment of the invention, the amplifying unit further includes a first divider resistor, a second divider resistor and a capacitor. Therein, the second divider resistor and the first divider resistor are connected in series between an operating voltage and a ground, and a common connection point of the first divider resistor and the second divider resistor is configured to generate the reference voltage. The capacitor is coupled between the common connection point of the first divider resistor and the second divider resistor, and the ground.

Based on above, the detection signal corresponding to an equivalent capacitance value of the micro-electro-mechanical system is generated by the oscillator, and the location of the micro-electro-mechanical system can be accurately obtained according to the frequency variation of the detection signal.

To make the above features and advantages of the disclosure more comprehensible, several embodiments accompanied with drawings are described in detail as follows.

DESCRIPTION OF THE EMBODIMENTS

Figure 1:
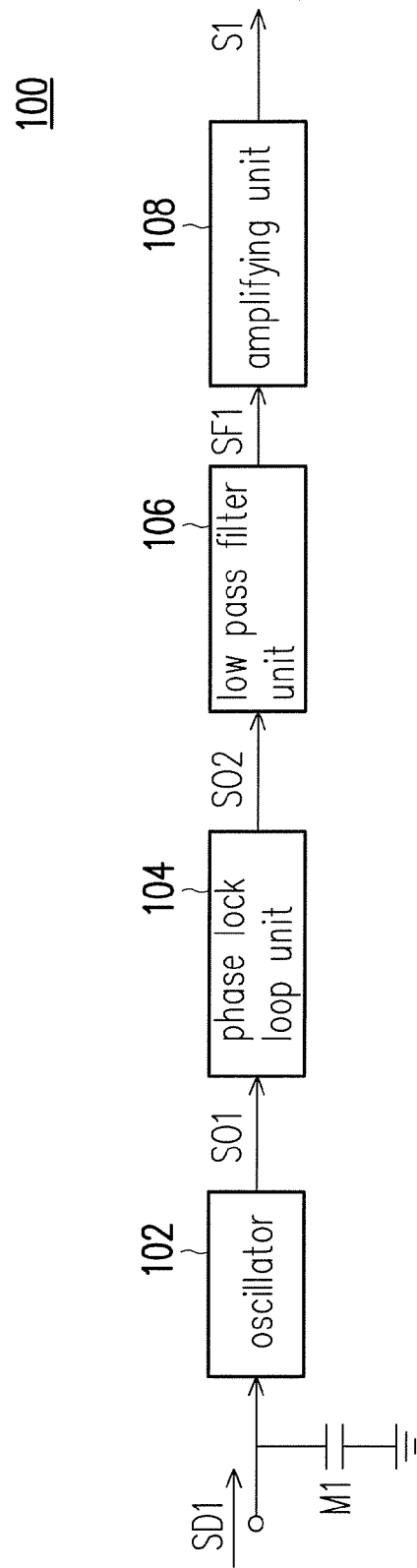
FIG. 1 is a block diagram of a detection circuit according to an embodiment of the invention.

FIG. 1 is a block diagram of a detection circuit according to an embodiment of the invention. Referring to FIG. 1, a detection circuit 100 configured to detect a shifted location of a micro-electro-mechanical system includes an oscillator 102, a phase lock loop unit 104, a low pass filter unit 106 and an amplifying unit 108. Therein, an input terminal of the oscillator 102 is coupled to the micro-electro-mechanical system. In FIG. 1, a capacitor M1 represents an equivalent capacitance of the micro-electro-mechanical system, and the oscillator 102 generates an oscillation signal SO1 according to an equivalent capacitance value of the micro-electro-mechanical system. Said oscillation signal SO1 is a frequency modulation signal. When the micro-electro-mechanical system is driven by a driving signal SD1 to start operating, a capacitance value of the micro-electro-mechanical system varies with changes of its location. For instance, in case the micro-electro-mechanical system is a motor, a capacitance value of the micro-electro-mechanical system varies with changes of a rotating angle of the motor. On the contrary, in case the capacitance value of the micro-electro-mechanical system is not changed, this indicates that the micro-electro-mechanical system has stopped rotating. Therefore, states of the location of the micro-electro-mechanical system can be obtained according to changes of the capacitance value.

The phase lock loop unit 104 is configured to perform a phase lock to the oscillation signal SO1 outputted by the oscillator 102, so as to output the phase lock control signal SO2 which is phase-locked. The low pass filter unit 106 is configured to perform a low pass filtration to the phase lock control signal SO2 to reduce a high frequency noise, so as to generating a filter signal SF1. The amplifying unit 108 is configured to amplify the filter signal SF1 in which the high frequency noise has been filtered out, so as to generate a detection signal S1. Accordingly, the location of the micro-electro-mechanical system can be accurately obtained according to a voltage variation of the detection signal S1.

Figure 2:
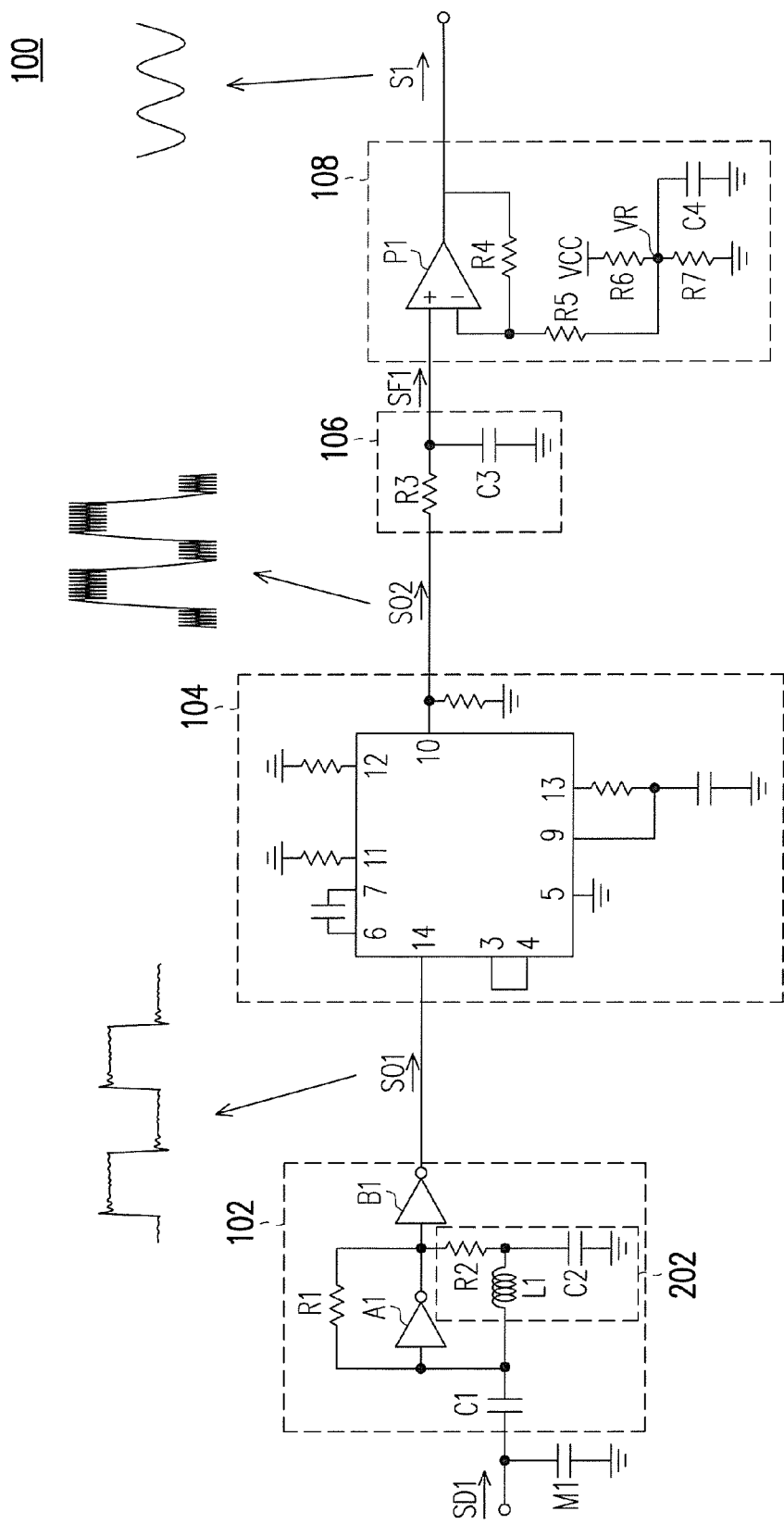
FIG. 2 is a schematic circuit diagram of the detection circuit depicted in FIG. 1.

FIG. 2 is a schematic circuit diagram of the detection circuit depicted in FIG. 1. More specifically, in an implementation of the detection circuit 100 as shown in FIG. 2, the oscillator 102 can include a blocking capacitor C1, an inverting unit A1, a low pass filter unit 202, a feedback resistor R1 and a buffer unit B1. Therein, the blocking capacitor C1 is coupled to an input terminal of the inverting unit A1; the low pass filter unit 202 is coupled between the input terminal and an output terminal of the inverting unit A1; the feedback resistor R1 is coupled between the input terminal and the output terminal of the inverting unit A1; and the buffer unit B1 is coupled between the output terminal of the inverting unit A1 and the phase lock loop unit 104. In the present embodiment, as shown in FIG. 2, the low pass filter unit 202 includes an inductor L1, a resistor R2 and a capacitor C2. Therein, the resistor R2 and the capacitor C2 are connected in series between the output terminal of the inverting unit A1 and a ground, and the inductor L1 is coupled between the input terminal of the inverting unit A1 and a common connection point of the resistor R2 and the capacitor C2.

When the micro-electro-mechanical system is driven by a driving signal SD1 to start operating, the equivalent capacitance M1 of the micro-electro-mechanical system varies with changes of the location of the micro-electro-mechanical system. Therefore, a capacitor voltage on the equivalent capacitance M1 of the micro-electro-mechanical system also varies with changes of the location of the micro-electro-mechanical system. A DC component of the capacitor voltage can be filtered out by the blocking capacitor C1, and inputted to the output terminal of the inverting unit A1 and a low pass filter unit 202. The low pass filter unit 202 is composed of the inductor L1, the resistor R2 and the capacitor C2. Therein, the capacitor voltage inputted to the inverting unit A1 is inverted, and feedbacked by the feedback resistor R1 to the output terminal of the inverting unit A1, so that the inductor L1, the resistor R2 and the capacitor C2 can start an oscillation. In addition, the low pass filter unit 202 composed of the inductor L1, the resistor R2 and the capacitor C2 is also capable of filtering out the high frequency noise. The buffer unit B1 buffers a voltage signal outputted by the inverting unit A1 so as to output the oscillation signal SO1. Since movements of the micro-electro-mechanical system can change the capacitance value of the equivalent capacitance M1, an oscillation frequency of the oscillation signal SO1 is also changed accordingly.

It should be noted that, an implementation of the oscillator 102 is not limited to the present embodiment. For instance, in some embodiments, based on actual applications, at least one of the blocking capacitor C1 and the buffer unit B1 can be omitted.

The phase lock loop unit 104 can be implemented by, for example, a 74HC4046 chip, and an implementation thereof is as shown in the FIG. 1, thus the related description is omitted hereinafter. The phase lock loop unit 104 can perform the phase lock to the oscillation signal SO1 so as to output the phase lock control signal SO2, which means that a frequency variation of the oscillating frequency of the oscillation signal SO1 can be converted into the voltage variation.

It should be noted that, an implementation of the phase lock loop unit 104 in the present embodiment is merely of an exemplary embodiment, the actual applications are not limited thereto.

In addition, the low pass filter unit 106 can include, for example, a resistor R3 and a capacitor C3, in which the resistor R3 is coupled between an output terminal of the phase lock loop unit 104 and an input terminal of the amplifying unit 108, and the capacitor C3 is coupled between the input terminal of the amplifying unit 108 and a ground. The low pass filter unit 106 composed of the resistor R3 and the capacitor C3 can perform the low pass filtration to the phase lock control signal SO2 so as to filter out the high frequency noise of the phase lock control signal SO2 such that the filter signal SF1 can be outputted to the amplifying unit 108 to be processed into signals required by circuits at rear stage.

The amplifying unit 108 can include, for example, an operational amplifier OP1, resistors R4 and R5, divider resistors R6 and R7, and a capacitor C4. Therein, a positive input terminal of the operational amplifier OP1 is coupled to the low pass filter unit 106; the resistor C4 is coupled between a negative input terminal and an output terminal of the operational amplifier OP1; the resistor R5 is coupled between the negative input terminal of operational amplifier OP1 and a common connection point of the divider resistor R6 and the divider resistor R7; and the divider resistor R6 and the divider resistor R7 are coupled between an operating voltage VCC and a ground. In addition, the capacitor C4 is coupled between the common connection point of the divider resistor R6, the divider resistor R7, and the ground.

An amplifying circuit formed of the operational amplifier OP1, the resistors R4 and R5 can amplify a voltage amplitude of the filter signal SF1 so as output a detection signal, as shown in FIG. 2. Accordingly, the location of the micro-electro-mechanical system can be accurately obtained according to the voltage variation of the detection signal S1. The capacitor C4, the divider resistor R6 and the divider resistor R7 can form a regulator circuit which can provide a reference voltage VR to the resistor R5, so as to perform a regulation to the amplifying circuit formed of the operational amplifier OP1, the resistors R4 and R5.

In summary, according to the invention, the detection signal corresponding to a capacitance value of the micro-electro-mechanical system is generated by the oscillator, and the location of the micro-electro-mechanical system can be accurately obtained according to the voltage variation of the detection signal.

What is claimed is:

1. A detection circuit, suitable for detecting a location of a micro-electro-mechanical system, comprising:
    an oscillator having an input terminal coupled to the micro-electro-mechanical system, and generating a first oscillation signal according to an equivalent capacitance value of the micro-electro-mechanical system;
    a phase lock loop unit performing a phase lock to the first oscillation signal to output a phase lock control signal;
    a first low pass filter unit being coupled to the phase lock loop unit, and performing a low pass filtration to the phase lock control signal to generate a filter signal; and
    an amplifying unit being coupled to the first low pass filter unit, and amplifying the filter signal to generate a detection signal,
    wherein the oscillator comprises:
    an inverting unit having an input terminal coupled to the micro-electro-mechanical system;
    a second low pass filter unit being coupled between the input terminal and an output terminal of the inverting unit;
    a feedback resistor being coupled between the input terminal and the output terminal of the inverting unit; and
    a buffer unit being coupled between the output terminal of the inverting unit and the phase lock loop unit, and buffering a voltage outputted by the inverting unit.

2. The detection circuit of claim 1, further comprising:
    a blocking capacitor coupled between the micro-electro-mechanical system and the input terminal of the inverting unit.

3. The detection circuit of claim 1, wherein the second low pass filter unit comprises:
    a resistor having a ten al coupled to the output terminal of the inverting unit;
    a capacitor coupled between another terminal of the resistor and a ground; and
    an inductor coupled between a common connection point of the resistor and the capacitor, and the input terminal of the inverting unit.

4. The detection circuit of claim 1, wherein the first low pass filter unit comprises:
    a resistor coupled between an output terminal of the phase lock loop unit and an input terminal of the amplifying unit; and
    a capacitor coupled between the input terminal of the amplifying unit and a ground.

5. A detection circuit, suitable for detecting a location of a micro-electro-mechanical system, comprising:
    an oscillator having an input terminal coupled to the micro-electro-mechanical system, and generating a first oscillation signal according to an equivalent capacitance value of the micro-electro-mechanical system;
    a phase lock loop unit performing a phase lock to the first oscillation signal to output a phase lock control signal;
    a first low pass filter unit being coupled to the phase lock loop unit, and performing a low pass filtration to the phase lock control signal to generate a filter signal; and
    an amplifying unit being coupled to the first low pass filter unit, and amplifying the filter signal to generate a detection signal, wherein the amplifying unit comprises:
    an operational amplifier having a positive input terminal coupled to the first low pass filter unit;
    a first resistor coupled between a negative input terminal and an output terminal of the operational amplifier;
    a second resistor coupled between the negative input terminal of the operational amplifier and a reference voltage;
    a first divider resistor;
    a second divider resistor connected with the first divider resistor in series between an operating voltage and a ground, and a common connection point of the first divider resistor and the second divider resistor being configured to generate the reference voltage; and
    a capacitor coupled between the common connection point of the first divider resistor and the second divider resistor, and the ground.

* * * * *